(12) United States Patent
Cilia et al.

(10) Patent No.: US 6,607,113 B2
(45) Date of Patent: Aug. 19, 2003

(54) APPARATUS AND METHOD FOR REMOVING A SOLDERED DEVICE FROM A PRINTED CIRCUIT BOARD

(75) Inventors: Michael C. Cilia, Fremont, CA (US); Gurpreet S. Dayal, Fremont, CA (US); Don Nguyen, Sunnyvale, CA (US); Arthur K. May, Cupertino, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/992,609

(22) Filed: Nov. 14, 2001

(65) Prior Publication Data

US 2002/0033409 A1 Mar. 21, 2002

Related U.S. Application Data

(62) Division of application No. 09/502,188, filed on Feb. 10, 2000, now Pat. No. 6,360,934.

(51) Int. Cl.$^7$ .............................................. B23K 37/04
(52) U.S. Cl. ................................. 228/19; 228/49.5
(58) Field of Search ........................ 228/19, 49.5, 55, 228/264, 6.2; 29/403.3, 403.1; 269/903, 288, 287

(56) References Cited

U.S. PATENT DOCUMENTS

| | | | | |
|---|---|---|---|---|
| 3,253,327 A | * | 5/1966 | McElligatt | 29/278 |
| 3,317,989 A | * | 5/1967 | Cull | 29/747 |
| 3,443,297 A | * | 5/1969 | Lusby, Jr. | 29/239 |
| 3,579,795 A | * | 5/1971 | Burman | 219/230 |
| 3,632,973 A | * | 1/1972 | O'Keefe | 219/228 |
| 3,895,214 A | * | 7/1975 | Winter | 219/230 |
| 4,270,260 A | | 6/1981 | Krueger | |
| 4,389,912 A | * | 6/1983 | Dallons et al. | 29/278 |
| 4,561,586 A | * | 12/1985 | Abel et al. | 228/119 |
| 4,569,473 A | | 2/1986 | Guiliano | |
| 4,752,025 A | | 6/1988 | Stach et al. | |
| 4,767,047 A | | 8/1988 | Todd et al. | |
| 4,844,325 A | | 7/1989 | Nishiguchi et al. | |
| 4,962,878 A | * | 10/1990 | Kent | 219/229 |
| 5,549,240 A | * | 8/1996 | Urban | 228/19 |
| 5,598,965 A | | 2/1997 | Scheu | |
| 5,941,444 A | | 8/1999 | Sadler et al. | |
| 6,360,934 B1 | | 3/2002 | Cilia et al. | |

* cited by examiner

Primary Examiner—M. Alexandra Elve
Assistant Examiner—Jonathan Johnson
(74) Attorney, Agent, or Firm—Meyertons, Hood, Kivlin, Kowert & Goetzel, P.C.; Eric B. Meyertons

(57) ABSTRACT

A rework nozzle includes a gripping device that is used to remove a soldered device from a circuit board. The rework nozzle attaches to a module that generates hot gas. The device that is to be removed from the circuit board is placed within the nozzle. The module generates hot gas, and the hot gas is directed by the nozzle to soldered connections that couple the device to the circuit board. The hot gas melts the solder and the gripping mechanism is used to grasp the device. The device may be removed from the circuit board by separating the circuit board from the nozzle after the hot gas melts the solder. The nozzle will release the device if the force needed to remove the device is greater than the force applied to the device by the gripping mechanism. The release of the device will prevent damage to the device or to the circuit board.

19 Claims, 4 Drawing Sheets

APPARATUS AND METHOD FOR REMOVING A SOLDERED DEVICE FROM A PRINTED CIRCUIT BOARD

This patent is a divisional of application Ser. No. 09/502,188 filed Feb. 10, 2000 now U.S. Pat. No. 6,360,934.

BACKGROUND OF THE INVENTION

1. Field of the Invention

This invention relates generally to the removal of electronic components from a printed circuit board. More particularly, the invention relates to an apparatus and method for uniformly melting solder and removing a combination surface mount and plated through hole (PTH) device from a printed circuit board.

2. Description of the Related Art

Many electronic systems include a printed circuit board (PCB) with several surface mount and plated through hole (PTH) devices connected to the PCB. As used herein, the term surface mount and PTH device includes semiconductor packages, and connectors, such as matched impedance connectors. Frequently, surface mount and PTH devices are connected to the PCB by solder. Sometimes it is necessary to remove a surface mount or PTH device from a PCB. When removing a soldered device from a PCB, it is necessary to melt the solder that attaches the device to the PCB so that the device may be lifted from the PCB.

Removing a surface mount and PTH device from a PCB may cause problems. Problems may arise because flow control nozzles do not uniformly distribute a hot gas stream to the soldered connections holding a device onto a printed circuit board. A non-uniform hot gas stream may cause the solder connecting the device to the PCB to melt unevenly. When the device is lifted from the PCB, unevenly melted solder may cause greater resistance to removal at certain areas of the board. The greater resistance to removal may result in damage to the device and/or the PCB.

A surface mount and PTH device may be damaged upon prolonged exposure to heat. When removing a device, it is desirable to quickly and evenly heat and melt solder so that the device may be quickly and efficiently removed from a PCB. The device should not be exposed to heat for a prolonged period of time during the process of removing the device from the PCB.

A hot gas nozzle may be used to direct hot gas to solder that couples a device to a PCB. When the hot gas melts the solder, the nozzle is removed. Then, the device may be lifted from the PCB. A surface mount device may be lifted from the PCB with a vacuum cup. A surface mount and PTH device may necessitate the use of more force to remove the device from the PCB. A surface mount and PTH device may be lifted from the PCB with a pair of pliers. It is desirable to be able to heat and remove a device using only a single instrument, thus eliminating the need to use a vacuum cup or a pair of pliers to remove a device from a PCB.

When removing a device from a PCB, the device or the board may be damaged if the solder connection is not completely melted and force is applied to remove the device from the PCB. It is desirable to have an instrument that will remove the device from the board if the solder is completely melted, but will release the device if the solder is not completely melted.

SUMMARY OF THE INVENTION

The problems outlined above may in large part be solved by a nozzle that includes a grip mechanism. The nozzle may channel hot gas to melt solder that connects a device to a circuit board. The device may be a surface mount and plated through hole device. The grip mechanism of the nozzle may grasp the device so that the device can be removed from the circuit board by moving the circuit board away from the nozzle after the solder has been melted. Alternately, the device may be removed from the circuit board by moving the nozzle away from the circuit board. The grip mechanism within the nozzle may also provide proper hot gas flow distribution within the nozzle so that hot gas is delivered to an output end of the nozzle in a substantially uniform manner that facilitates uniform melting of solder holding the device to the circuit board.

The grip mechanism may include a spring mechanism. When the grip mechanism is used to remove the device from the circuit board, if the lifting force applied to the device exceeds a certain value, the spring mechanism will release the device. The release of the device may prevent damage to the device and damage to the circuit board when the solder connecting the device to the circuit board is not melted enough to allow the device to be removed from the circuit board.

An advantage of the nozzle is that the nozzle may have a size and shape that permits the reworking of the circuit board in confined areas. A further advantage of the nozzle is that the nozzle incorporates a grip mechanism. The grip mechanism increases the efficiency of removing a device by eliminating the use of pliers or other instruments during the removal of the device from the circuit board. After hot gas directed at solder connections by the nozzle melts the solder connecting the device to the circuit board, the grip mechanism may be used to securely grasp the device. Then, the nozzle may be raised from a position adjacent to the circuit board. Raising the nozzle will cause the device to be removed from the circuit board if the solder connections holding the device to the board were completely melted. If the solder connections were not completely melted, the gripping mechanism will release the device if the force applied to remove the device exceeds the force applied to the device by the gripping mechanism. Further advantages of the nozzle include having a device that is sturdy, durable, light weight, simple, efficient, reliable and inexpensive; yet the nozzle is easy to manufacture, install, maintain and use.

Figure 1:
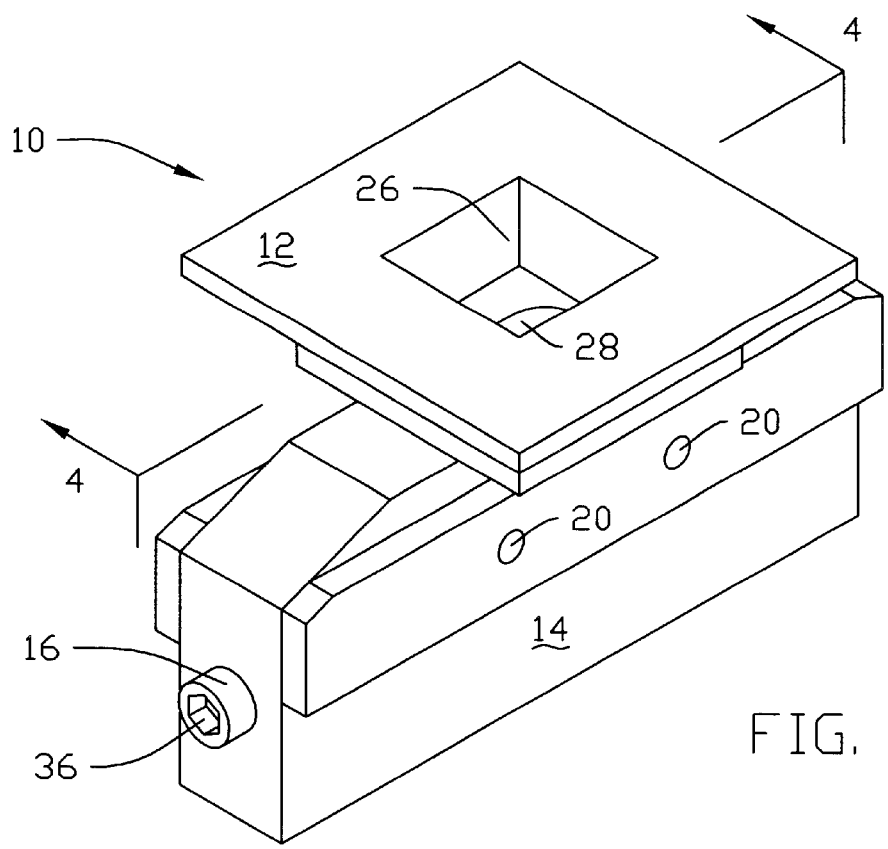
FIG. 1 is a perspective view of a nozzle showing a top of the nozzle.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
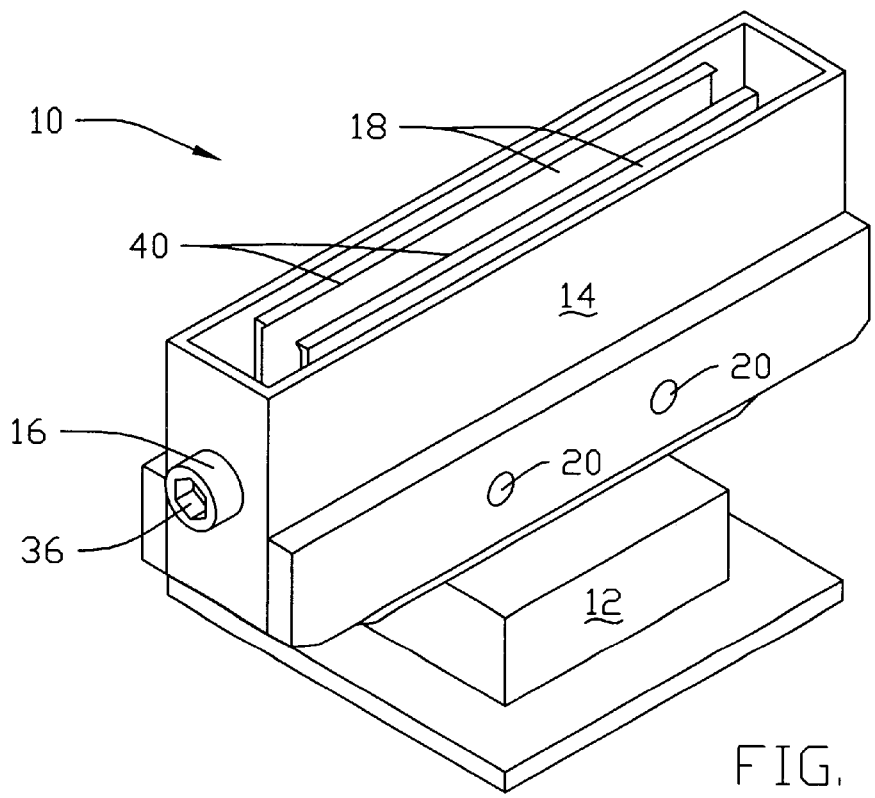
FIG. 2 is a perspective view of a nozzle showing an output end of the nozzle.

Referring to the drawings, a nozzle is designated by reference numeral 10. FIGS. 1 and 2 show perspective views of a nozzle 10. The nozzle 10 may include upper body 12, lower body 14, spacer 16, a pair of clamp plates 18, supports 20, and springs 22 (shown in FIGS. 4–6). Preferably, the components that form the nozzle are made of steel. Materials other than steel, such as other metals, ceramics, or polymers, may also be used to form the nozzle 10. The upper body 12 and the lower body 14 may be formed from several plates. The plates that form the bodies 12, 14 may be joined together by any suitable fasteners (not shown) such as screws, nuts and bolts, glue, and/or welds. The springs 22 may be metallic coil springs, or the springs may be formed from a spring-like elastic material.

Figure 3:
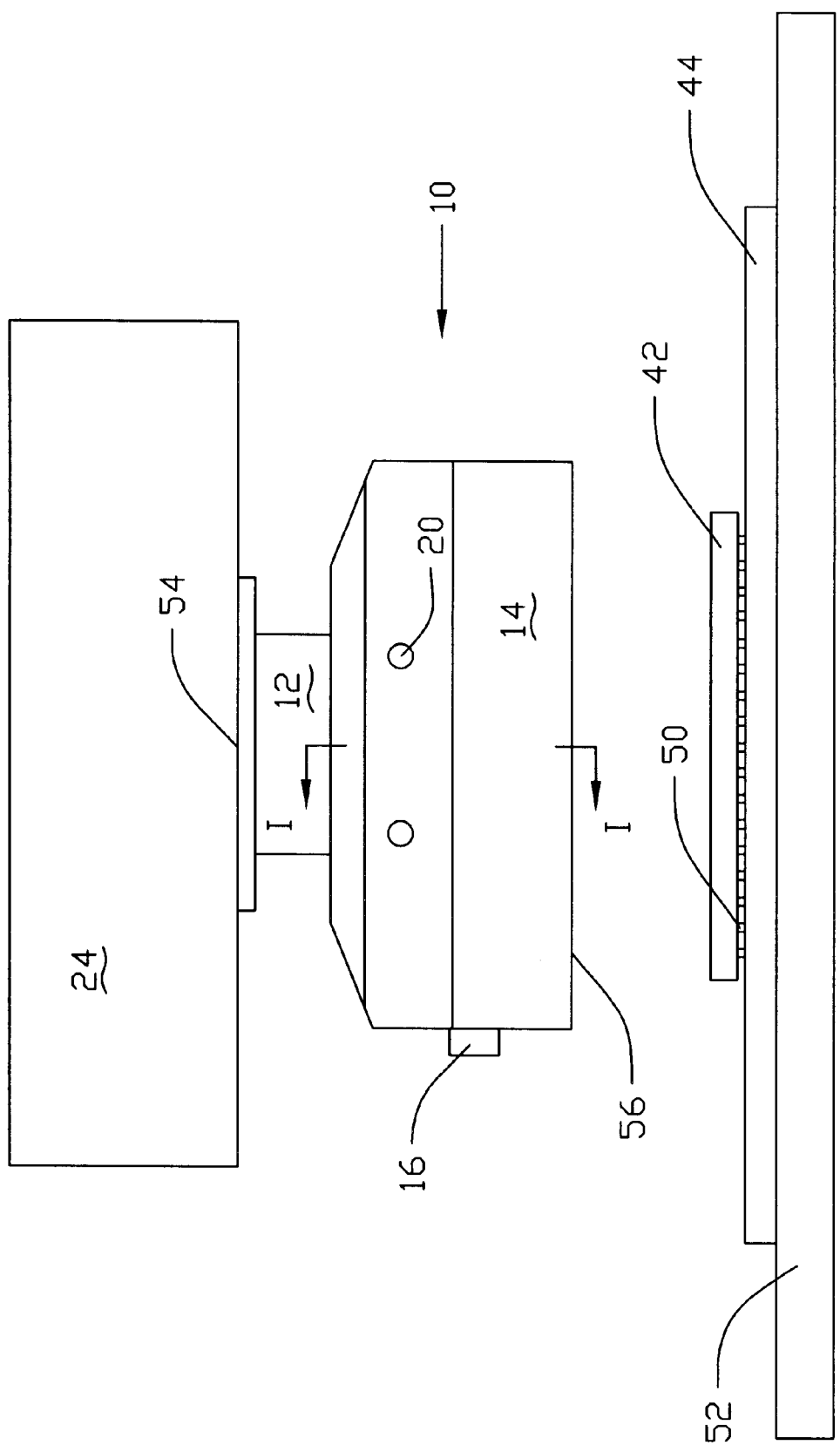
FIG. 3 is an elevational view of a system for removing a device from a circuit board.
Figure 4:
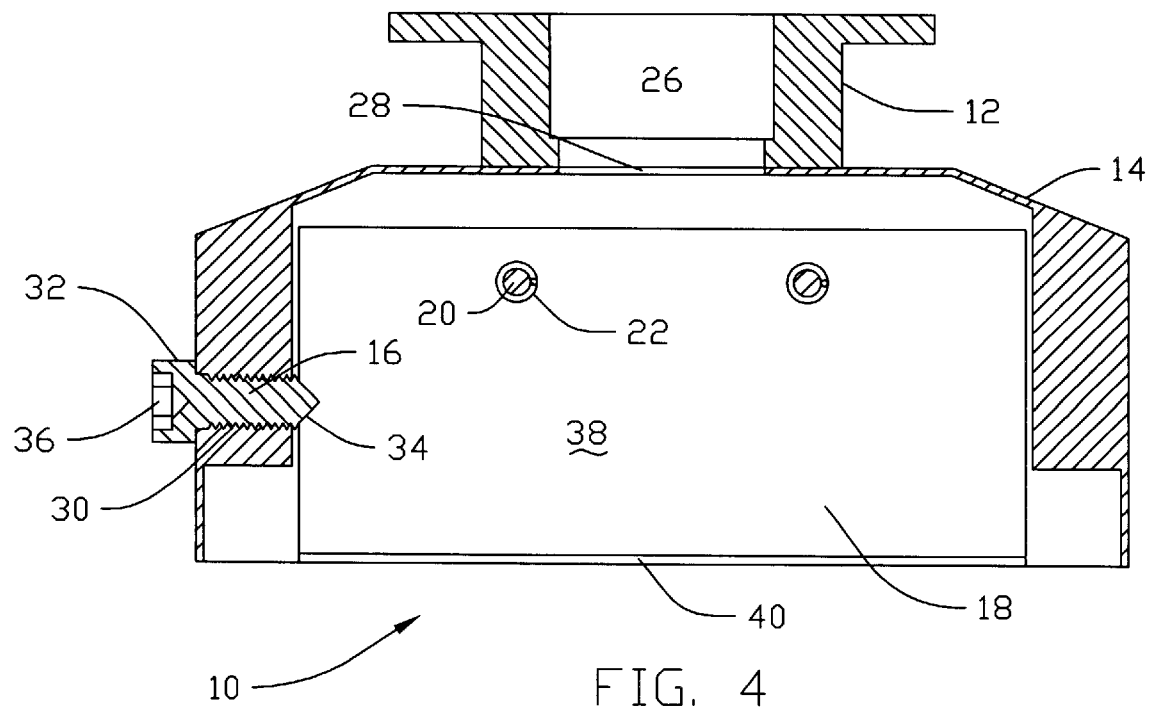
FIG. 4 is a cross sectional view of a nozzle taken substantially along cutting plane 4—4 of FIG. 1.

The upper body 12 may be attached to module 24, as shown in FIG. 3. A gasket (not shown) may be placed between a gas exit of the module 24 and the upper body 12 of the nozzle 10. A suitable fastening system (not shown) may be used to securely attach the nozzle 10 to the module 24. Suitable fastening systems may include, but are not limited to, screws, clamps, glue, slotted openings in the module 24, and/or welds. As shown in FIG. 4, the upper body 12 may include gas flow channel 26 that directs hot gas from the module 24 to the lower body 14. Gas entry 28, which may be located between the upper body 12 and the lower body 14, allows gas to flow from the module 24, through the upper body, and into the lower body.

As shown in FIG. 4, the spacer 16, clamp plates 18, supports 20, and springs 22 may be housed within the lower body 14. The spacer 16 may be a fastener such as a screw or bolt. The spacer 16 may include threaded shaft 30, head 32, and tapered end 34. The threaded shaft 30 may be threaded into the lower body 14. The head 32 of the spacer 16 may include tool slot 36. The tool slot 36 may be configured to receive a drive end of an insertion tool (not shown), such as a hex wrench or a screw driver. Alternately, the head 32 of the spacer may be configured to be driven with a socket wrench. The tapered end 34 of the spacer 16 may contact surface 38 of each clamp plate 18.

Figure 5:
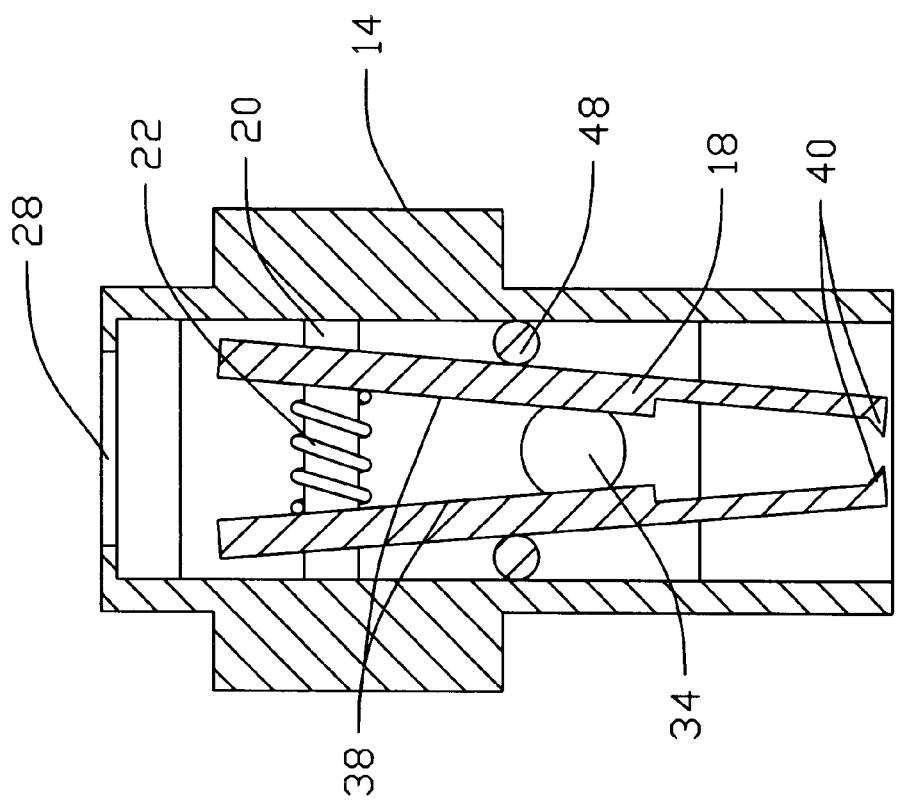
FIG. 5 is a partial cross sectional view of a nozzle taken substantially along line I—I of FIG. 3 when clamp plates of the nozzle are in an open position.
Figure 6:
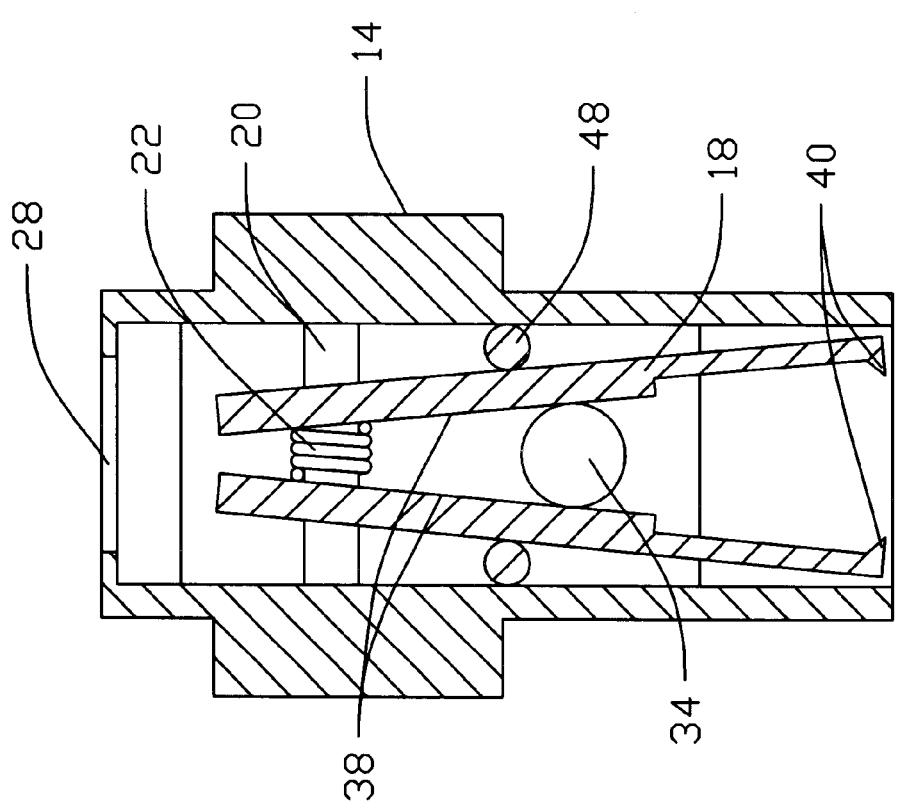
FIG. 6 is a partial cross sectional view of a nozzle taken substantially along line I—I of FIG. 3 when clamp plates of the nozzle are in a partially closed position.

The contact between the tapered end 34 of the spacer 16 and the clamp plates 18 forms a separation distance between grip ends 40 of the clamp plates. As shown in FIGS. 5 and 6, the separation distance between the grip ends 40 may be adjusted by threading the spacer 16 into or out of the lower body 14. FIG. 5 shows a cross sectional view of the lower body 14 when the spacer 16 is threaded into the lower body so that the separation distance between the grip ends 40 of the clamp plates 18 is maximized. FIG. 6 shows a cross sectional view of the lower body 14 when the spacer 16 is only partially threaded into the lower body 14 so that the separation distance between the grip ends 40 is less than the maximum separation distance.

When the separation distance between the clamping plates 18 is at or near the maximum separation distance, the nozzle 10 may be placed over device 42 that is to be removed from circuit board 44. The device 42 may be a surface mount and plated through hole device. The device 42 may be a semiconductor package, or the device may be a connector such as a matched impedance connector (mictor). The device 42 and the circuit board 44 are shown in FIG. 3. The nozzle 10 substantially surrounds a perimeter of the device 42. When hot gas directed through the nozzle 10 melts solder that attaches the device 42 to the circuit board 44, the spacer 16 may be partially threaded out of the lower body 14 to reduce the separation distance between the grip ends 40 so that the grip ends securely grasp the device. Springs 22 provide force to the clamp plates 18 that allow the grip ends 40 to securely grasp the device 42. If the force needed to remove the device 42 from the circuit board 44 exceeds the force applied to the device by the grip ends 40, the grip ends will slide off of the body of the device and release the device during removal of the device from the circuit board. The ability of the nozzle 10 to release the device 42 may prevent damage to the device and to the circuit board 44 should the solder that connects the device to the circuit board not be completely melted during an attempt to remove the device from the circuit board. If the gripping force exerted by the grip ends 40 exceeds the force needed to remove the device 42 from the circuit board 44, the device may be removed from the circuit board 44 by moving the circuit board away from the nozzle 10, or by raising the nozzle from the circuit board.

Figure 7:
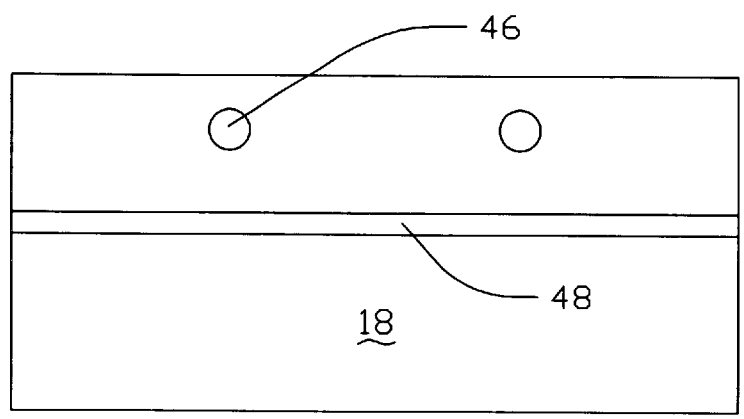
FIG. 7 is a back elevational view of a clamping plate.

FIG. 7 shows a back view of a clamp plate 18. The clamp plate 18 may include mounting holes 46 and pivot rod 48. When the nozzle 10 is assembled, the supports 20 may be positioned through the mounting holes 46 and into the lower body 14 so that the clamp plates 18 are mounted within the lower body. The springs 22, which may be positioned between the two clamp plates 18 on the supports 20, force the pivot rods 48 against the lower body 14. The pivot rods 48 allow the clamp plates 18 to rotate relative to the lower body 14 so that a separation distance between the grip ends 40 of the clamp plates 18 may be adjusted when the spacer 16 is threaded into or out of the lower body. When the tapered end 34 of the spacer 16 contacts the surfaces 38 of the clamp plates 18, the contact causes the clamp plates to rotate about the pivot rods 48 and the tapered end so that a particular separation distance between the grip ends 40 is established. The clamp plates 18 compress the springs 22 when the tapered end 34 of the spacer 16 contacts the surfaces 38 of the clamp plates. When the spacer 16 is threaded out of the lower body 14 so that the tapered end 34 withdraws from the surfaces 38, the springs 22 expand and cause the clamp plates 18 to rotate so that the separation distance between the grip ends 40 of the clamp plates is reduced.

As shown in FIG. 7, the pivot rods 48 may extend longitudinally across the back of the clamp plates 18. When the pivot rods 48 are mounted within the lower body 14 of the nozzle 10, the pivot rods contact the lower body across a substantial portion of the lower body 14. The contact between the pivot rods 48 and the lower body 14 may help to direct hot gas introduced into the lower body 14 between the clamp plates 18. Hot gas that flows between the clamp plates 18 may be directed by the grip ends 40 towards solder that fastens connectors 50 (shown in FIG. 3) of the device 42 to the circuit board 44.

The spacer 16, clamp plates 18, and springs 22 may function as a grip mechanism. The springs 22 are connected to the plates 18 so that the springs force the grip ends 40 of the clamp plates 18 together. The spacer 16 may be inserted between the two clamp plates so that a particular separation distance between the grip ends 40 may be established.

To use a nozzle 10 to remove a device 42 from a circuit board 44, a user may attach the nozzle to a module 24. FIG. 3 shows a nozzle 10 attached to a module 24. The spacer 16 may be adjusted so that the separation distance between the grip ends 40 is at or near the maximum separation distance. The circuit board 44 may be placed on and secured to board positioner 52. The board positioner 52 may then be used to adjust the position of the circuit board 44 so that the circuit board is adjacent to the nozzle 10 and so that the device 42 to be removed from the circuit board is located between the clamp plates 18 within the lower body 14. The module 24 may then be used to generate hot gas. The hot gas from the module 24 passes from the module and into an input end 54 of the nozzle 10 through the gas flow channel 26. The hot gas passes into the lower body 14 of the nozzle 10 through the gas entry 28. The hot gas is directed between the clamp plates 18. The grip ends 40 of the clamp plates direct the hot gas to solder that couples the connectors 50 of the device 42 to the circuit board 44. The hot gas melts the solder and passes through output end 56 of the nozzle 10. When the solder melts, the spacer 16 may be partially threaded out of the lower body 14 so that the springs 22 force the grip ends 40 of the clamp plates 18 to securely grasp the device 42. The positioner 52 may then be used to move the circuit board 44 away from the nozzle 10. Alternately, the nozzle 10 may be withdrawn from the circuit board 44. If the force applied by the grip ends 40 to the device 42 is less than the force needed to remove the device from the circuit board 44, the nozzle 10 will release the device when the nozzle is separated from the circuit board. The nozzle 10 may then be repositioned over the device and heat may be reapplied to the solder to completely melt the solder connections. If the force applied by the grip ends 40 to the device 42 is greater than the force needed to remove the device from the circuit board 44, the nozzle 10 will remove the device 42 from the circuit board when the nozzle is separated from the circuit board. The device 42 will be located between the clamp plates 18. The spacer 16 may then be threaded into the lower body 14 to cause the separation distance between the clamp plates 18 to widen so that the device 42 is released from the nozzle 10.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A nozzle for removing a device from a circuit board, comprising:
    a body having a gas inlet and a gas outlet, the body configured to surround a perimeter of the device during use; and
    a grip mechanism coupled to the body, the grip mechanism configured to grip the device to allow the device to be removed from the circuit board, wherein the grip mechanism comprises a spring member positioned between a pair of plates, and wherein the spring member applies forces to the pair of plates to establish a separation distance between contact ends of the plates that contact the device.

2. The nozzle of claim 1, wherein the grip mechanism is configured to direct gas received through the gas inlet to the device.

3. The nozzle of claim 1, wherein the grip mechanism is configured to remove the device from the circuit board when the circuit board is separated from the body.

4. The nozzle of claim 1, wherein the pair of plates are pivotally mounted within the body, and wherein each plate comprises a rotation member that extends substantially across the plate in a longitudinal direction, and wherein the rotation members are forced against the body by the spring member.

5. The nozzle of claim 1, wherein the grip mechanism is configured to release the device held by the grip mechanism during use if a force required to remove the device from the circuit board is greater than a force applied by the grip mechanism to the device.

6. A nozzle for removing a device from a circuit board, comprising
    a body having a portion configured to surround the device so that fluid flow directed through the body is directed against solder that attaches the device to the circuit board; and gripping means coupled to the body, the gripping means configured to grasp the device, wherein the gripping means comprises an elastic member positioned between a pair of plates, and wherein the elastic member is configured to apply forces to the pair of plates that establish a separation distance between contact ends of the pair of plates that contact the device.

7. The nozzle of claim 6, wherein the elastic member comprises a spring member.

8. The nozzle of claim 7, further comprising an adjuster, wherein the adjuster controls a separation distance between the contact ends of the pair of plates.

9. The nozzle of claim 6, wherein the body comprises a first end configured to couple to a hot fluid supply.

10. The nozzle of claim 1, wherein the device comprises a matched impedance connector.

11. The nozzle of claim 6, wherein the device comprises a matched impedance connector.

12. The nozzle of claim 6, wherein the elastic member is configured to release the plate during use when solder attaches the device to the circuit board to inhibit damage to the device.

13. A nozzle for removing a device from a circuit board, comprising:
    a body having a gas inlet and a gas outlet, the body configured to surround a perimeter of the device during use;
    a pair of plates mounted in the body, each of the plates having a grip end;
    a spring member coupled to the plates, the spring member configured to cause the grip ends to approach each other to contact the device and allow the device to be removed from the circuit board;
    a retractable spacer positionable in the body, the retractable spacer configured to adjust a separation distance between the grip ends.

14. The nozzle of claim 13, wherein the spring member comprises at least one spring positioned between the plates.

15. The nozzle of claim 13, wherein the spring member comprises elastic material positioned between the plates.

16. The nozzle of claim 13, wherein the retractable spacer comprises a threaded fastener having a tapered end, and wherein threading the fastener into or out of the body adjusts the separation distance between the grip ends.

17. The nozzle of claim 13, wherein the plates are configured to direct gas entering the gas inlet to solder that attaches the device to the circuit board.

18. The nozzle of claim 13, wherein the spring member is configured to release the plate during use when solder attaches the device to the circuit board to inhibit damage to the device.

19. The nozzle of claim 13, wherein each plate comprises a rotation member configured to contact the body, and wherein the spring member is configured to press the rotation member against the body.

* * * * *